United States Patent
Lin et al.

(10) Patent No.: US 10,658,435 B2
(45) Date of Patent: May 19, 2020

(54) DISPLAY PANEL

(71) Applicant: Au Optronics Corporation, Hsinchu (TW)

(72) Inventors: Chun-Yu Lin, Hsinchu (TW); Meng-Ting Lee, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 38 days.

(21) Appl. No.: 15/942,585

(22) Filed: Apr. 2, 2018

(65) Prior Publication Data
US 2019/0206945 A1 Jul. 4, 2019

(30) Foreign Application Priority Data
Dec. 28, 2017 (TW) .............................. 106146327 A (51) Int. Cl.
*H01L 27/32* (2006.01)
*H01L 27/146* (2006.01)
*H01L 51/52* (2006.01)

(52) U.S. Cl.
CPC ...... *H01L 27/323* (2013.01); *H01L 27/14621* (2013.01); *H01L 27/322* (2013.01); *H01L 51/5203* (2013.01); *H01L 51/5284* (2013.01); *H01L 27/3246* (2013.01)

(58) Field of Classification Search
CPC ............. H01L 27/14621; H01L 27/323; H01L 27/3246; H01L 51/5203; H01L 27/322; H01L 27/3272; H01L 27/3276; H01L 27/156; H01L 51/5284; G02F 1/136286; G06F 3/0412
See application file for complete search history.

(56) References Cited

U.S. PATENT DOCUMENTS

| | | | |
|---|---|---|---|
| 8,723,413 B2 | 5/2014 | Chen | |
| 9,166,199 B2 | 10/2015 | Kim et al. | |
| 9,710,090 B2 | 7/2017 | Choi | |
| 2005/0225238 A1* | 10/2005 | Yamazaki | H01L 27/322 313/506 |

(Continued)

FOREIGN PATENT DOCUMENTS

| | | |
|---|---|---|
| CN | 103855314 | 6/2014 |
| CN | 105575998 | 5/2016 |

(Continued)

*Primary Examiner* — Richard J Hong
(74) *Attorney, Agent, or Firm* — JCIPRNET (57) ABSTRACT

A display panel includes an active device disposed on a substrate, a first electrode electrically connected to the active device, a pixel definition layer, a light emitting layer, a second electrode, a shielding pattern layer, and first and second color filter pattern layers. The pixel definition layer has a first opening overlapped with the first electrode. At least a portion of the light emitting layer is disposed within the first opening and on the first electrode. The second electrode is disposed on the light emitting layer. The shielding pattern layer is disposed on the second electrode and has a second opening overlapped with the first opening. The first color filter pattern layer is disposed on the second electrode and overlapped with the first and second openings. The second color filter pattern layer is disposed on the second electrode. The first and second color filter pattern layers are stacked with each other right above the shielding pattern layer.

14 Claims, 3 Drawing Sheets

(56) References Cited

U.S. PATENT DOCUMENTS

| | | | |
|---|---|---|---|
| 2010/0265206 A1 | 10/2010 | Chen | |
| 2013/0135540 A1* | 5/2013 | Nam | G02F 1/136286 |
| | | | 349/12 |
| 2014/0145159 A1 | 5/2014 | Kim et al. | |
| 2015/0318447 A1* | 11/2015 | Choi | H01L 27/322 |
| | | | 257/98 |
| 2016/0005790 A1* | 1/2016 | Li | H01L 27/156 |
| | | | 257/89 |
| 2016/0124557 A1 | 5/2016 | Choi | |
| 2018/0348931 A1* | 12/2018 | Kim | G06F 3/0412 |
| 2019/0006429 A1* | 1/2019 | Ota | H01L 27/3272 |
| 2019/0079617 A1* | 3/2019 | Li | G06F 3/0412 |
| 2019/0129552 A1* | 5/2019 | Lee | G06F 3/0412 |
| 2019/0165077 A1* | 5/2019 | Kim | H01L 27/3276 |

FOREIGN PATENT DOCUMENTS

| | | |
|---|---|---|
| JP | 2014050903 | 3/2014 |
| TW | 201039304 | 11/2010 |

* cited by examiner

DISPLAY PANEL

CROSS-REFERENCE TO RELATED APPLICATION

This application claims the priority benefit of Taiwan application serial no. 106146327, filed on Dec. 28, 2017. The entirety of the above-mentioned patent application is hereby incorporated by reference herein and made a part of this specification.

TECHNICAL FIELD

The disclosure relates to a display panel, and more particularly, to a self-luminescent display panel.

RELATED ART

In recent years, active matrix organic light-emitting diode (AMOLED) technologies continue to make breakthroughs, and the AMOLED has been successfully applied to portable display panels. At present, one of the commonly used technologies for making a full-color AMOLED display panel has applied a structure having a color filter layer and an organic light-emitting diode (OLED) which is used as a light source. To increase the contrast, said structure is often equipped with a black matrix (BM). However, said BM may easily cause the AMOLED display panel severe color shift due to viewing angle change because the AMOLED display panel has a cell gap of up to about 18 μm.

SUMMARY

An embodiment of the invention provides a display panel for resolving the color shift issue due to viewing angle change.

An embodiment of the invention provides a display panel for enhancing the display quality.

In an embodiment of the invention, a display panel includes an active device, a first electrode, a pixel definition layer, a light emitting layer, a second electrode, a shielding pattern layer, a first color filter pattern layer, and a second color filter pattern layer. The active device is disposed on a substrate. The first electrode is electrically connected to the active device. The pixel definition layer has a first opening overlapped with the first electrode. The light emitting layer is overlapped with the first opening and located on the first electrode. At least a portion of the light emitting layer is disposed within the first opening and located on the first electrode. The second electrode is disposed on the light emitting layer. The shielding pattern layer is disposed on the second electrode and has a second opening overlapped with the first opening. The first color filter pattern layer is disposed on the second electrode and overlapped with the first and second openings. The second color filter pattern layer is disposed on the second electrode, wherein the first color filter pattern layer and the second color filter pattern layer are stacked with each other right above the shielding pattern layer.

In an embodiment of the invention, a display panel includes a plurality of active devices, a plurality of first electrodes, a pixel definition layer, a plurality of light emitting layers, at least one second electrode, a shielding pattern layer, a first color filter pattern layer, and a second color filter pattern layer. The active devices are disposed on a substrate. The first electrodes are electrically connected to the active devices, respectively. The pixel definition layer has a plurality of first openings respectively overlapped with the first electrodes. The light emitting layers are overlapped with the first openings and located on the first electrodes, respectively. The at least one second electrode is disposed on the light emitting layers. The shielding pattern layer is disposed on the at least one second electrode and has a plurality of second openings overlapped with the first openings, respectively. The first color filter pattern layer is disposed on the at least one second electrode and overlapped with a corresponding one of the first openings and a corresponding one of the second openings. The second color filter pattern layer is disposed on the at least one second electrode, wherein a stacked portion formed by the second color filter pattern layer and the first color filter pattern layer is right above the shielding pattern layer and not overlapped with the second openings.

In view of the above, the display panel provided in an embodiment of the invention includes the active device located on the substrate, the first electrode electrically connected to the active device, the pixel definition layer having the first opening overlapped with the first electrode, the light emitting layer overlapped with the first opening and on the first electrode, the second electrode disposed on the light emitting layer, the shielding pattern layer disposed on the second electrode and having a second opening overlapped with the first opening, the first color filter pattern layer disposed on the second electrode and overlapped with the first opening and the second opening, and the second color filter pattern layer stacked with the first color filter pattern layer right above the shielding pattern layer. Hence, in comparison with the conventional display panel, the display panel described herein has a smaller cell gap and a better viewing angle range, such that the defect of color shift due to viewing angle change may be rectified.

To make the above features and advantages provided in one or more of the embodiments of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

DETAILED DESCRIPTION OF THE INVENTION

Figure 1:
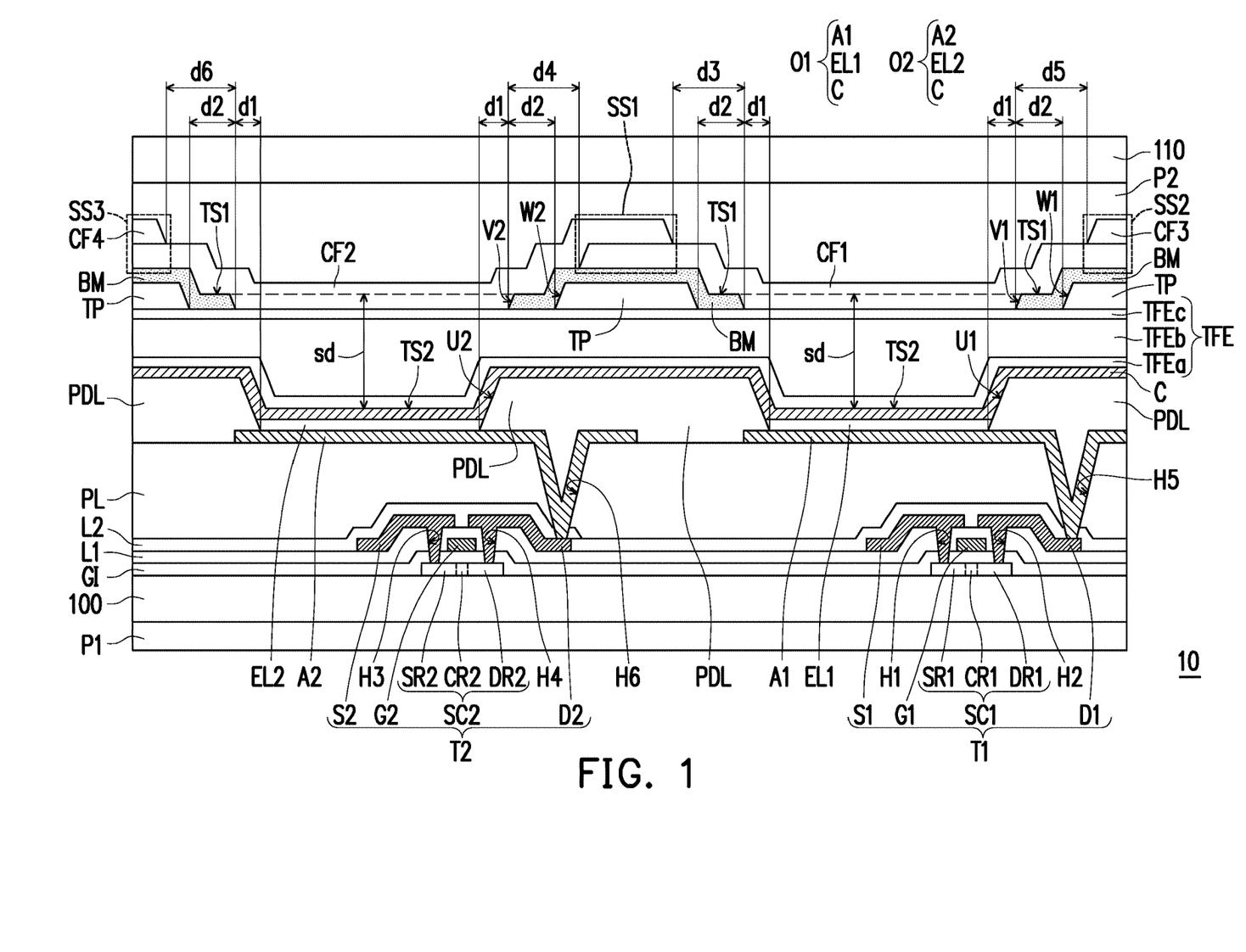
FIG. 1 is a schematic cross-sectional view of a portion of the display panel according to an embodiment of the disclosure.
Figure 2:
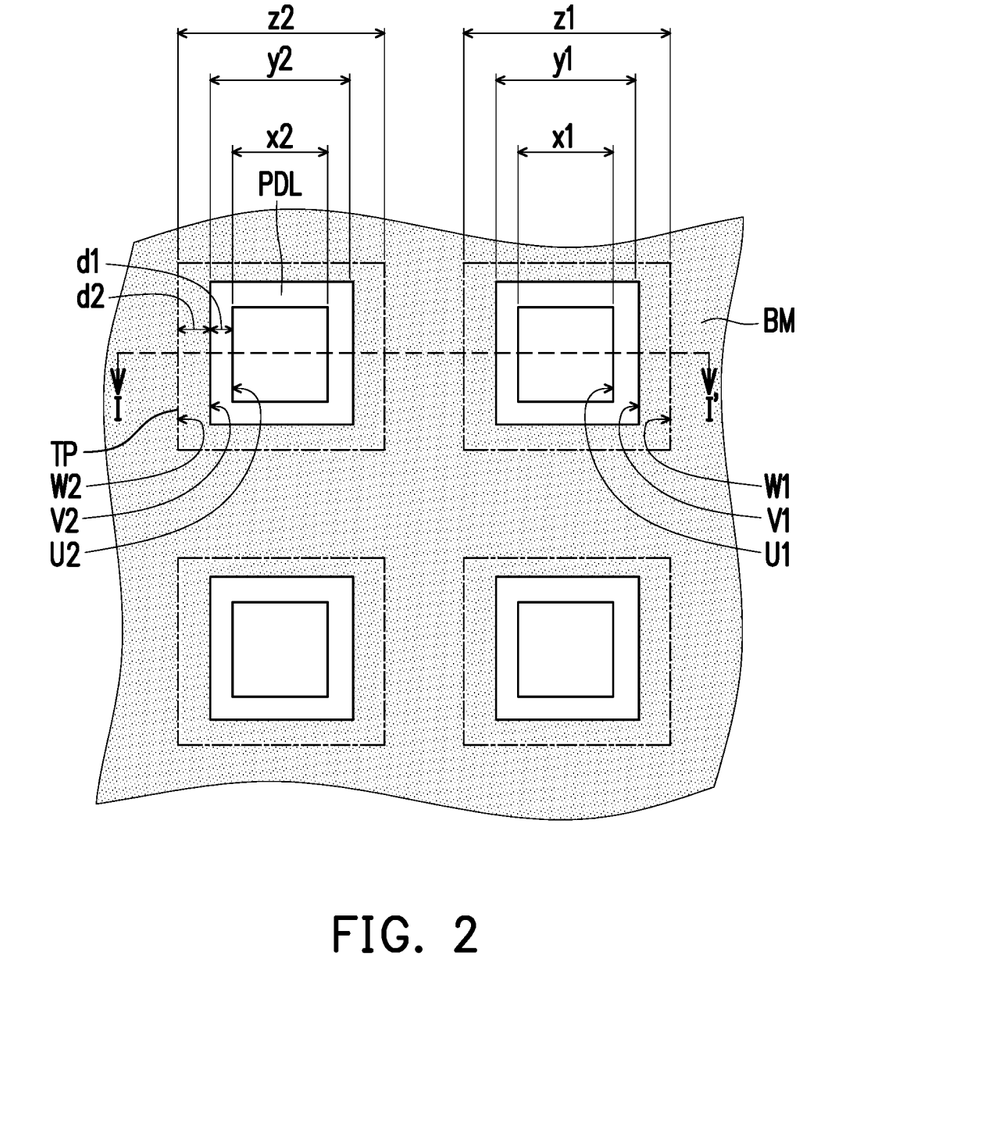
FIG. 2 is a schematic top view illustrating an arrangement of the pixel definition layer, the touch structure, and the shielding pattern layer depicted in FIG. 1.

FIG. 1 is a schematic cross-sectional view of a portion of the display panel according to an embodiment of the disclosure. FIG. 2 is a schematic top view illustrating an arrangement of the pixel definition layer, the touch structure, and the shielding pattern layer depicted in FIG. 1. Note that the cross-sectional position shown in FIG. 1 may be referred to as the position of a sectional line I-I' depicted in FIG. 2.

With reference to FIG. 1 and FIG. 2, the display panel 10 is a self-luminescent display panel, for instance. In the present embodiment, the display panel 10 is exemplified as an OLED display panel. The display panel 10 provided in the present embodiment includes a substrate 100, an active device T1, an active device T2, a first electrode A1, a first electrode A2, a pixel definition layer PDL, a light emitting layer EL1, a light emitting layer EL2, a second electrode C, a shielding pattern layer BM, a color filter pattern layer CF1, a color filter pattern layer CF2, a color filter pattern layer CF3, and a color filter pattern layer CF4. Besides, in this embodiment, the display panel 10 may further include a protection layer P1, a gate insulation layer GI, an interlayer insulation layer L1, an interlayer insulation layer L2, a planarization layer PL, a package structure layer TFE, a touch structure layer TP, a protection layer P2, and a cover plate 110.

The substrate 100 provided in this embodiment may be a flexible substrate, such as a polymer substrate or a plastic substrate, but the invention is not limited thereto. In other embodiments, the substrate 100 may also be a rigid substrate, e.g., a glass substrate, a quartz substrate, or a silicon substrate.

According to the present embodiment, the protection layer P1 is disposed on one side of the substrate 100 and configured to balance the stress between the substrate 100 and the cover plate 110 in the display panel 10. In the present embodiment, the material of the protection layer P1 may include polyethylene terephthalate (PET), polyimide (PI), or triacetylcellulose (TAC).

In the present embodiment, the cover plate 110 and the substrate 100 are disposed opposite to each other. The cover plate 110 provided in this embodiment may be a flexible substrate, such as a polymer substrate or a plastic substrate, but the invention is not limited thereto. In other embodiments, the cover plate 110 may also be a rigid substrate, e.g., a glass substrate, a quartz substrate, or a silicon substrate. In another aspect, both the cover plate 110 and the substrate 100 provided in this embodiment may be transparent, which should however not be construed as being limited to the embodiment set forth herein. In other embodiments, one of the cover plate 110 and the substrate 100 is transparent.

According to the present embodiment, the active device T1 and the active device T2 are disposed on the substrate 100. The active device T1 provided in the present embodiment includes a semiconductor layer SC1, a gate G1, a source S1, and a drain D1. The semiconductor layer SC1 includes a source region SR1, a drain region DR1, and a channel region CR1. The gate G1 is located above and overlapped with the channel region CR1. The source S1 is electrically connected to the source region SR1 through a contact window H1 formed in the gate insulation layer GI (elaborated hereinafter) and the interlayer insulation layer L1 (elaborated hereinafter). The drain D1 is electrically connected to the drain region DR1 through a contact window H2 formed in the gate insulation layer GI (elaborated hereinafter) and the interlayer insulation layer L1 (elaborated hereinafter). Besides, in the present embodiment, the active device T2 provided in the present embodiment includes a semiconductor layer SC2, a gate G2, a source S2, and a drain D2. The semiconductor layer SC2 includes a source region SR2, a drain region DR2, and a channel region CR2. The gate G2 is located above and overlapped with the channel region CR2. The source S2 is electrically connected to the source region SR2 through a contact window H3 formed in the gate insulation layer GI (elaborated hereinafter) and the interlayer insulation layer L1 (elaborated hereinafter). The drain D2 is electrically connected to the drain region DR2 through a contact window H4 formed in the gate insulation layer GI (elaborated hereinafter) and the interlayer insulation layer L1 (elaborated hereinafter). That is, in the present embodiment, the active device T1 and the active device T2 are top-gate thin film transistors (TFT), but the invention is not limited thereto. According to other embodiments, the active devices T1 and T2 may be bottom-gate TFTs.

In this embodiment, the materials of the gate G1, the source S1, the drain D1, the gate G2, the source S2, and the drain D2 may include metal, alloy, nitrides of the aforesaid materials, oxides of the aforesaid materials, oxynitrides of the aforesaid materials, a transparent conductive material, other non-metallic but electrically conductive materials, or other suitable materials. The materials of the semiconductor layer SC1 and the semiconductor layer SC2 provided in the embodiment may include polysilicon or a metal oxide semiconductor material, e.g., indium gallium zinc oxide, zinc oxide, tin oxide, indium zinc oxide, gallium zinc oxide, zinc tin oxide, or indium tin oxide.

In this embodiment, the gate insulation layer GI may be entirely formed on the substrate 100 and covers the semiconductor layer SC1 and the semiconductor layer SC2. The gate insulation layer GI may be of a single-layer structure or a multi-layer structure, and the material of the gate insulation layer GI may include an inorganic material, an organic material, or other appropriate materials. Here, the inorganic material includes but is not limited to silicon oxide, silicon nitride, or silicon oxynitride, for instance, and the organic material includes but is not limited to, polyimide resins, epoxy resins, or acrylic resins, for instance.

In the present embodiment, the interlayer insulation layer L1 may be entirely formed on the substrate 100 and covers the gate G1 and the gate G2. The interlayer insulation layer L1 may be of a single-layer structure or a multi-layer structure, and the material of the interlayer insulation layer L1 may include an inorganic material, an organic material, or other appropriate materials. Here, the inorganic material includes but is not limited to silicon oxide, silicon nitride, or silicon oxynitride, for instance, and the organic material includes but is not limited to, polyimide resins, epoxy resins, or acrylic resins, for instance.

The interlayer insulation layer L2 provided in the present embodiment is entirely formed on the substrate 100 and covers the active devices T1 and T2 to provide insulation and protection. The interlayer insulation layer L2 may be of a single-layer structure or a multi-layer structure, and the material of the gate insulation layer GI may include an inorganic material, an organic material, or other appropriate materials. Here, the inorganic material includes but is not limited to silicon oxide, silicon nitride, or silicon oxynitride, for instance, and the organic material includes but is not limited to, polyimide resins, epoxy resins, or acrylic resins, for instance.

In the present embodiment, the first electrode A1 and the second electrode A2 are electrically connected to the active device T1 and the active device T2, respectively. According to the present embodiment, the first electrode A1 is electrically connected to the drain D1 of the active device T1 through a contact window H5 formed in the planarization layer PL (elaborated hereinafter) and the interlayer insulation layer L2 (elaborated hereinafter), and the first electrode A2 is electrically connected to the drain D2 of the active device T2 through a contact window H6 formed in the planarization layer PL (elaborated hereinafter) and the interlayer insulation layer L2 (elaborated hereinafter). Besides, the material of the first and second electrodes A1 and A2 may include a transparent conductive material or a non-transparent conductive material. The transparent conductive material may include a metal oxide conductive material, e.g., indium tin oxide, indium zinc oxide, aluminum tin oxide, aluminum zinc oxide, indium gallium zinc oxide, other suitable oxides, or a stacked layer of at least two of the aforesaid materials. The non-transparent conductive material may include metal.

The planarization layer PL provided in the present embodiment may be entirely formed on the substrate 100 and covers the active devices T1 and T2 to provide protection and ensure planarization. The planarization layer PL may be of a single-layer structure or a multi-layer structure, and the material of the planarization layer PL may include an inorganic material, an organic material, or other appropriate materials. Here, the inorganic material includes but is not limited to silicon oxide, silicon nitride, or silicon oxynitride, for instance, and the organic material includes but is not limited to, polyimide resins, epoxy resins, or acrylic resins, for instance.

According to the present embodiment, the pixel definition layer PDL is disposed on the first electrode A1 and the first electrode A2. The pixel definition layer PDL provided in the present embodiment has a first opening U1 and a first opening U2 that are respectively overlapped with the first electrode A1 and the first electrode A2. That is, in the present embodiment, the first opening U1 and the first opening U2 may be configured to expose a portion of the first electrode A1 and a portion of the first electrode A2, respectively. Besides, in the embodiment, the material of the pixel definition layer PDL may include a photosensitive polyimide material, a propylene-based material, a siloxane material, a phenolic resin material, oxides, nitrides, or oxynitrides. However, the invention is not limited thereto. The material of the pixel definition layer PDL may include a non-black insulation material, which should however not be construed as a limitation in the disclosure.

According to the present embodiment, as shown in FIG. 2, the pixel definition layer PDL has a grid-shaped layout. In other words, the pixel definition layer PDL is a patterned film layer. From another perspective, the embodiments shown in FIG. 1 and FIG. 2 merely describe the first opening U1 and the first opening U2; however, as shown in FIG. 2, the pixel definition layer PDL may actually be equipped with two or more first openings. In view of the above, the first openings (including the first opening U1 and the first opening U2) of the pixel definition layer PDL described in the present embodiment and depicted in FIG. 2 are aligned to form a matrix.

The light emitting layer EL1 and the light emitting layer EL2 provided in the embodiment are respectively overlapped with the first opening U1 and the first opening U2. The light emitting layer EL1 and the light emitting layer EL2 may be respectively disposed within the first opening U1 and the first opening U2 and respectively located on the first electrode A1 and the first electrode A2. At least a portion of the light emitting layer EL1 may be disposed within the first opening U1 and located on the first electrode A1. At least a portion of the light emitting layer EL2 may be disposed within the first opening U2 and located on the first electrode A2. The light emitting layers EL1 and EL2 provided in the present embodiment may respectively be any light emitting layer that can be used in the OLED display panel and are well-known to people having ordinary skill in the art. The light emitting layers EL1 and EL2 may respectively include organic light emitting materials in red, green, blue, white, or other colors, or a combination of said light emitting materials. For instance, in an embodiment, the light emitting layer EL1 may include a white organic light emitting material, and the light emitting layer EL2 may also include a white organic light emitting material. That is, the lights emitted via the light emitting layer EL1 and the light emitting layer EL2 are white lights. In an embodiment, for instance, the color of the light emitting layer EL1 and the color of the light emitting layer EL2 are of different colors, wherein the light emitting layer EL1 may include a green organic light emitting material, and the light emitting layer EL2 may include a red organic light emitting material. That is, the color of the light emitting layer EL1 is green, and the color of the light emitting layer EL2 is red. Besides, the light emitting layers EL1 and EL2 may respectively include an electron transport layer, an electron injection layer, a hole transport layer, a hole injection layer, or a combination of said four film layers.

In the present embodiment, the second electrode C is disposed on the light emitting layer EL1 and the light emitting layer EL2. In the present embodiment, the second electrode C is entirely formed on the substrate 100. That is, the display panel 10 provided in the embodiment has one second electrode C. Nevertheless, the disclosure should not be construed as limited to the embodiments set forth herein. In other embodiments, the display panel 10 may include a plurality of second electrodes formed by performing a patterning process. The material of the second electrode C may include a transparent conductive material or a non-transparent conductive material. The transparent conductive material may include a metal oxide conductive material, e.g., indium tin oxide, indium zinc oxide, aluminum tin oxide, aluminum zinc oxide, indium gallium zinc oxide, other suitable oxides, or a stacked layer of at least two of the aforesaid materials. The non-transparent conductive material may include metal.

In this embodiment, the first electrode A1, the light emitting layer EL1 and the portion of the second electrode C overlapped with the light emitting layer EL1 constitute an OLED O1, and the first electrode A2, the light emitting layer EL2 and the portion of the second electrode C overlapped with the light emitting layer EL2 constitute an OLED O2. Here, the first electrode A1 serves as the anode of the OLED O1, the first electrode A2 serves as the anode of the OLED O2, and the second electrode C serves as the cathode of the OLED O1 and the cathode of the OLED O2. However, in terms of design requirements, the first electrode A1 may also serve as the cathode of the OLED O1, the first electrode A2 may serve as the cathode of the OLED O2, and the second electrode C may serve as the anode of the OLED O1 and the anode of the OLED O2. The light emitting layer EL1 is driven by the voltage difference generated between the first electrode A1 and the second electrode C to emit light, and the light emitting layer EL2 is driven by the voltage difference generated between the first electrode A2 and the second electrode C to emit light. Hence, in an embodiment, if the light emitting layers EL1 and EL2 are white light emitting layers, the OLEDs O1 and O2 emit white light.

In the present embodiment, the package structure layer TFE is disposed on the OLEDs O1 and O2 for isolating moisture and impurities. The package structure layer TFE provided herein may include a first inorganic layer TFEa, an organic layer TFEb, and a second inorganic layer TFEc; however, the invention is not limited thereto. The organic layer TFEb is located between the first inorganic layer TFEa and the second inorganic layer TFEc, and the second inorganic layer TFEc is located on the organic layer TFEb. In addition, the material of the first inorganic layer TFEa may include silicon nitride or aluminum oxide, the material of the organic layer TFEb may include acrylic resins, epoxy resins, or silicon oxycarbide, and the material of the second inorganic layer TFEc may include silicon nitride or aluminum oxide.

In the present embodiment, the touch structure layer TP is disposed on the package structure layer TPE. That is, the display panel 10 can perform a touch function and is categorized as an in-cell touch display panel. According to the present embodiment, the touch structure layer TP is in contact with the second inorganic layer TFEc, which should not be construed as a limitation in the disclosure. The touch structure layer TP has a third opening W1 and a third opening W2 that are respectively overlapped with the first opening U1 and the first opening U2 of the pixel definition layer PDL. In the present embodiment, the width z1 of the third opening W1 is greater than the width x1 of the first opening U1, and the width z2 of the third opening W2 is greater than the width x2 of the first opening U2. In other words, according to the present embodiment, a vertical projection of the first opening U1 is completely located within a vertical projection of the third opening W1, and a vertical projection of the first opening U2 is completely located within a vertical projection of the third opening W2.

According to the present embodiment, as shown in FIG. 2, the touch structure layer TP has a grid-shaped layout. In other words, the touch structure layer TP is a patterned film layer. From another perspective, the embodiments shown in FIG. 1 and FIG. 2 merely describe the third opening W1 and the third opening W2; however, as shown in FIG. 2, the touch structure layer TP may actually be equipped with two or more third openings. In view of the above, the third openings (including the third opening W1 and the third opening W2) of the touch structure layer TP described in the present embodiment and depicted in FIG. 2 are aligned to form a matrix.

The touch structure layer TP provided in the present embodiment may include any type of capacitive touch structure known to people having ordinary skill in the art, e.g., a mutual-capacitive touch structure or a self-capacitive touch structure. Nevertheless, the disclosure should not be construed as limited to the embodiments set forth herein. In other embodiments, the touch structure layer TP may also include any other type of touch structure known to people having ordinary skill in the art, such as a resistive touch structure, an electromagnetic touch structure, etc.

In the present embodiment, the shielding pattern layer BM is disposed on the touch structure layer TP. As described above, since the touch structure layer TP is located on the package structure layer TFE and the package structure layer TFE is disposed on the OLED O1 and the OLED O2, the package structure layer TFE is disposed between the second electrode C and the shielding pattern layer BM, the touch structure layer TP is disposed between the second electrode C and the shielding pattern layer BM, and the shielding pattern layer BM is disposed on the second electrode C. The shielding pattern layer BM is in contact with the second inorganic layer TFEc, but the disclosure is not limited thereto. Besides, in the present embodiment, the material of the shielding pattern layer BM may be a black resin or a non-transparent material with low reflectivity, such as light shielding metal (e.g., chromium).

In the present embodiment, the shielding pattern layer BM has a second opening V1 and a second opening V2 that are respectively overlapped with the first opening U1 and the first opening U2 of the pixel definition layer PDL. As provided above, the third opening W1 and the third opening W2 of the touch structure layer TP are respectively overlapped with the first opening U1 and the first opening U2. Hence, given that the second opening V1 and the second opening V2 are respectively overlapped with the first opening U1 and the first opening U2, the third opening W1 overlaps the first opening U1 and the second opening V1, and the third opening W2 overlaps the first opening U2 and the second opening V2.

In the present embodiment, the width y1 of the second opening V1 is greater than the width x1 of the first opening U1, and the width y2 of the second opening V2 is greater than the width x2 of the first opening U2. In other words, according to the present embodiment, the vertical projection of the first opening U1 is completely located within a vertical projection of the second opening V1, and the vertical projection of the first opening U2 is completely located within a vertical projection of the second opening V2. In another aspect, the edge of the vertical projection of the pixel definition layer PDL on the substrate 100 protrudes by a distance d1 to the edge of the vertical projection of the shielding pattern layer BM on the substrate 100. In the present embodiment, the distance d1 may be about 3 μm to about 10 μm. In an embodiment, the distance d1 may be about 6 μm.

According to the present embodiment, since the edge of the vertical projection of the pixel definition layer PDL on the substrate 100 protrudes by the distance d1 to the edge of the vertical projection of the shielding pattern layer BM on the substrate 100, the light emitted from the OLED O1 and the OLED O2 may not be easily blocked by the shielding pattern layer BM. In particular, according to the present embodiment, since the distance d1 is about 3 μm to about 10 μm, the display panel 10 is still characterized by good contrast although the light emitted from the OLED O1 and the OLED O2 may not be easily blocked by the shielding pattern layer BM.

In the present embodiment, the width z1 of the third opening W1 is greater than the width y1 of the second opening V1, and the width z2 of the third opening W2 is greater than the width y2 of the second opening V2. That is, according to the present embodiment, a vertical projection of the second opening V1 is completely located within the vertical projection of the third opening W1, and a vertical projection of the second opening V2 is completely located within the vertical projection of the third opening W2. From another perspective, in the present embodiment, the shielding pattern layer BM covers the touch structure layer TP and contacts the package structure layer TFE located below the touch structure layer TP. Thereby, in the present embodiment, it is likely for the touch structure layer TP not to be seen by users.

According to the present embodiment, the minimum vertical distance sd between the upper surface TS1 of the shielding pattern layer BM and the upper surface TS2 of the portion of the second electrode C overlapped with the light emitting layer EL1 or the light emitting layer EL2 is about 3 μm to about 15 μm. In an embodiment, the minimum vertical distance sd is about 6 μm. Here, the minimum vertical distance sd between the upper surface TS1 and the upper surface TS2 is defined as a cell gap of the display panel 10.

According to the present embodiment, as shown in FIG. 2, the shielding pattern layer BM has a grid-shaped layout. In other words, the shielding pattern layer BM is a patterned film layer. From another perspective, the embodiments shown in FIG. 1 and FIG. 2 merely describe the second opening V1 and the second opening V2; however, as shown in FIG. 2, the shielding pattern layer BM may actually be equipped with two or more second openings. In view of the above, the second openings (including the second opening V1 and the second opening V2) of the shielding pattern layer BM described in the present embodiment and depicted in FIG. 2 are aligned to form a matrix.

The color filter pattern layer CF1 provided in the present embodiment is located on the second electrode C. The shielding pattern layer BM provided in the present embodiment is located between the color filter pattern layer CF1 and the second electrode C. Besides, the color filter pattern layer CF1 overlaps the first opening U1 and the second opening V1 according to the present embodiment. Namely, in the present embodiment, the color filter pattern layer CF1 overlaps the light emitting layer EL1 of the OLED O1. As such, the light emitted from the OLED O1 passes through the color filter pattern layer CF1.

The color filter pattern layer CF1 provided in the present embodiment may be any color filter pattern layer that can be used in the OLED display panel and is well-known to people having ordinary skill in the art. The color of the color filter pattern layer CF1 may be red, green, or blue. For instance, in an embodiment, when the light emitting layer EL1 includes the white organic light emitting material, the color of the color filter pattern layer CF1 may be green. Namely, the white light emitted by the light emitting layer EL1 is converted into a green light after passing through the color filter pattern layer CF1. In another example provided in an embodiment of the invention, if the light emitting layer EL1 includes the green organic light emitting material, the color of the color filter pattern layer CF1 may be green; namely, a light passing through the color filter pattern layer CF1 and a light emitted via the light emitting layer EL1 have same color. Hence, the green light emitted by the light emitting layer EL1 is still green after passing through the color filter pattern layer CF1.

The color filter pattern layer CF2 provided in the present embodiment is located on the second electrode C. The shielding pattern layer BM provided in the present embodiment is located between the color filter pattern layer CF2 and the second electrode C. Besides, the color filter pattern layer CF2 overlaps the first opening U2 and the second opening V2 according to the present embodiment. Namely, in the present embodiment, the color filter pattern layer CF2 overlaps the light emitting layer EL2 of the OLED O2. As such, the light emitted from the OLED O2 passes through the color filter pattern layer CF2.

The color filter pattern layer CF2 provided in the present embodiment may be any color filter pattern layer that can be used in the OLED display panel and is well-known to people having ordinary skill in the art. The color of the color filter pattern layer CF2 may be red, green, or blue. For instance, in an embodiment, when the light emitting layer EL2 includes the white organic light emitting material, the color of the color filter pattern layer CF2 may be red. Namely, the white light emitted by the light emitting layer EL2 is converted into a red light after passing through the color filter pattern layer CF2. In another example provided in an embodiment of the invention, when the light emitting layer EL2 includes the red organic light emitting material, the color of the color filter pattern layer CF2 may be red. Namely, a light passing through the color filter pattern layer CF2 and a light emitted via the light emitting layer EL2 have same color. Hence, the red light emitted by the light emitting layer EL2 is still red after passing through the color filter pattern layer CF2.

According to the present embodiment, the color of the color filter pattern layer CF2 and the color of the color filter pattern layer CF1 are different, and the color of the color filter pattern layer CF1 and the color of the color filter pattern layer CF2 may respectively be selected from a group consisting of the red color, the green color, and the blue color. For instance, in an embodiment, the color of the color filter pattern layer CF1 is green, and the color of the color filter pattern layer CF2 is red.

According to the present embodiment, the color filter pattern layer CF2 and the color filter pattern layer CF1 are stacked right above the shielding pattern layer BM to form a stacked layer structure SS1. As described above, the color of the color filter pattern layer CF2 is different from the color of the color filter pattern layer CF1. Therefore, if the ambient light is reflected by the shielding pattern layer BM, the reflected light passing through the stacked layer structure SS1 is completely absorbed. As a result, interference of the ambient light with the display panel 10 is reduced, and the hue in the dark state of the display panel 10 becomes more balanced or becomes closer to pure black.

Besides, in this embodiment, a stacked portion (i.e., the stacked layer structure SS1) formed by the color filter pattern layer CF2 and the color filter pattern layer CF1 does not overlap the second opening V1 and the second opening V2 of the shielding pattern layer BM. Namely, the vertical projection of the stacked layer structure SS1 is completely located within the vertical projection of the shielding pattern layer BM. From another perspective, in the present embodiment, the edge of the vertical projection of the shielding pattern layer BM on the substrate 100 protrudes by a distance d3 to the edge of the vertical projection of the color filter pattern layer CF2 on the substrate 100, and the edge of the vertical projection of the shielding pattern layer BM on the substrate 100 protrudes by a distance d4 to the edge of the vertical projection of the color filter pattern layer CF1 on the substrate 100. In the present embodiment, the distances d3 and d4 may be about 3 µm to about 10 µm, respectively. In an embodiment, the distances d3 and d4 may be about 6 µm, respectively.

As provided above, the color of the color filter pattern layer CF2 is different from the color of the color filter pattern layer CF1. Hence, due to the designs that the edge of the vertical projection of the shielding pattern layer BM on the substrate 100 protrudes by the distance d3 to the edge of the vertical projection of the color filter pattern layer CF2 on the substrate 100, and that the edge of the vertical projection of the shielding pattern layer BM on the substrate 100 protrudes by the distance d4 to the edge of the vertical projection of the color filter pattern layer CF1 on the substrate 100, the light emitted by the OLED O1 is not easily absorbed by the color filter pattern layer CF2, and the light emitted by the OLED O2 is not easily absorbed by the color filter pattern layer CF1. The distances d3 and d4 are respectively about 3 µm to about 10 µm, such that in the case that the light emitted by the OLED O1 is not easily absorbed by the color filter pattern layer CF2, and the light emitted by the OLED O2 is not easily absorbed by the color filter pattern layer CF1, the interference of the ambient light with the display panel 10 may still be effectively reduced to a greater extent.

Besides, in this embodiment, the stacked portion (i.e., the stacked layer structure SS1) formed by the color filter pattern layer CF2 and the color filter pattern layer CF1 does not overlap the third opening W1 and the third opening W2 of the touch structure layer TP. Namely, the vertical projection of the stacked layer structure SS1 is completely located within the vertical projection of the touch structure layer TP.

The color filter pattern layer CF3 provided in the present embodiment is located on the second electrode C. The shielding pattern layer BM provided in the present embodiment is located between the color filter pattern layer CF3 and the second electrode C. In another aspect, according to the present embodiment, the color filter pattern layer CF3 and the color filter pattern layer CF1 are stacked right above the shielding pattern layer BM to form a stacked layer structure SS2.

The color filter pattern layer CF3 provided in the present embodiment may be any color filter pattern layer that can be used in the OLED display panel and is well-known to people having ordinary skill in the art. The color of the color filter pattern layer CF3 may be red, green, or blue. According to the present embodiment, the color of the color filter pattern layer CF3 and the color of the color filter pattern layer CF1 are different, and the color of the color filter pattern layer CF1 and the color of the color filter pattern layer CF3 may respectively be selected from a group consisting of the red color, the green color, and the blue color. For instance, in an embodiment, the color of the color filter pattern layer CF1 is green, and the color of the color filter pattern layer CF3 is blue.

As described above, the color of the color filter pattern layer CF3 is different from the color of the color filter pattern layer CF1. Therefore, if the ambient light is reflected by the shielding pattern layer BM to generate a reflected light, the reflected light passing through the stacked layer structure SS2 is completely absorbed by the stacked layer structure SS2. As a result, interference of the ambient light with the display panel 10 is reduced, and the hue in the dark state of the display panel 10 becomes more balanced.

In this embodiment, a stacked portion (i.e., the stacked layer structure SS2) formed by the color filter pattern layer CF3 and the color filter pattern layer CF1 does not overlap the second opening V1 of the shielding pattern layer BM. Namely, the vertical projection of the stacked layer structure SS2 is completely located within the vertical projection of the shielding pattern layer BM. In another aspect, the edge of the vertical projection of the shielding pattern layer BM on the substrate 100 protrudes by a distance d5 to the edge of the vertical projection of the color filter pattern layer CF3 on the substrate 100. In the present embodiment, the distance d5 may be about 3 µm to about 10 µm. In an embodiment, the distance d5 may be about 6 µm.

As provided above, the color of the color filter pattern layer CF3 is different from the color of the color filter pattern layer CF1. Hence, due to the design that the edge of the vertical projection of the shielding pattern layer BM on the substrate 100 protrudes by the distance d5 to the edge of the vertical projection of the color filter pattern layer CF3 on the substrate 100, the light emitted by the OLED O1 is not easily absorbed by the color filter pattern layer CF3. Specifically, the distance d5 is about 3 µm to about 10 µm, such that in the case that the light emitted by the OLED O1 is not easily absorbed by the color filter pattern layer CF3, the interference of the ambient light with the display panel 10 may still be effectively reduced to a greater extent.

Besides, in this embodiment, the stacked portion (i.e., the stacked layer structure SS2) formed by the color filter pattern layer CF3 and the color filter pattern layer CF1 does not overlap the third opening W1 of the touch structure layer TP. Namely, the vertical projection of the stacked layer structure SS2 is completely located within the vertical projection of the touch structure layer TP.

The color filter pattern layer CF4 provided in the present embodiment is located on the second electrode C. The shielding pattern layer BM provided in the present embodiment is located between the color filter pattern layer CF4 and the second electrode C. In another aspect, according to the present embodiment, the color filter pattern layer CF2 is located between the color filter pattern layer CF4 and the shielding pattern layer BM, and the color filter pattern layer CF4 and the color filter pattern layer CF2 are stacked right above the shielding pattern layer BM to form a stacked layer structure SS3.

The color filter pattern layer CF4 provided in the present embodiment may be any color filter pattern layer that can be used in the OLED display panel and is well-known to people having ordinary skill in the art. The color of the color filter pattern layer CF4 may be red, green, or blue. According to the present embodiment, the color of the color filter pattern layer CF4 and the color of the color filter pattern layer CF2 are different, and the color of the color filter pattern layer CF4 and the color of the color filter pattern layer CF3 are the same. For instance, in an embodiment, the color of the color filter pattern layer CF2 is red, and the color of the color filter pattern layer CF4 is blue.

As described above, the color of the color filter pattern layer CF4 is different from the color of the color filter pattern layer CF2. Therefore, if the ambient light is reflected by the shielding pattern layer BM to generate a reflected light, the reflected light passing through the stacked layer structure SS3 is completely absorbed by the stacked layer structure SS3. As a result, interference of the ambient light with the display panel 10 is reduced, and the hue in the dark state of the display panel 10 becomes more balanced.

In this embodiment, a stacked portion (i.e., the stacked layer structure SS3) formed by the color filter pattern layer CF4 and the color filter pattern layer CF2 does not overlap the second opening V2 of the shielding pattern layer BM. Namely, the vertical projection of the stacked layer structure SS3 is completely located within the vertical projection of the shielding pattern layer BM. In another aspect, the edge of the vertical projection of the shielding pattern layer BM on the substrate 100 protrudes by a distance d6 to the edge of the vertical projection of the color filter pattern layer CF4 on the substrate 100. In the present embodiment, the distance d6 may be about 3 µm to about 10 µm. In an embodiment, the distance d6 may be about 6 µm.

As provided above, the color of the color filter pattern layer CF4 is different from the color of the color filter pattern layer CF2. Hence, due to the design that the edge of the vertical projection of the shielding pattern layer BM on the substrate 100 protrudes by the distance d6 to the edge of the vertical projection of the color filter pattern layer CF4 on the substrate 100, the light emitted by the OLED O2 is not easily absorbed by the color filter pattern layer CF4. Specifically, the distance d6 is about 3 µm to about 10 µm, such that in the case that the light emitted by the OLED O2 is not easily absorbed by the color filter pattern layer CF4, the interference of the ambient light with the display panel 10 may still be effectively reduced to a greater extent.

Besides, in this embodiment, the stacked portion (i.e., the stacked layer structure SS3) formed by the color filter pattern layer CF4 and the color filter pattern layer CF2 does not overlap the third opening W2 of the touch structure layer TP. Namely, the vertical projection of the stacked layer structure SS3 is completely located within the vertical projection of the touch structure layer TP.

In the present embodiment, the protection layer P2 is disposed among the color filter pattern layer CF2, the color filter pattern layer CF3, the color filter pattern layer CF4, and the cover plate 110 to provide protection. According to this embodiment, the material of the protection layer P2 includes a polymer material, such as epoxy resin, acrylic resin, or the like.

In the present embodiment, the color filter pattern layer CF1 is disposed on the OLED O1 and overlaps the first opening U1 and the second opening V1, the color filter pattern layer CF2 is disposed on the OLED O2 and overlaps the first opening U2 and the second opening V2, the color filter pattern layer CF2 and the color filter pattern layer CF1 are stacked right above the shielding pattern layer BM, the color filter pattern layer CF3 and the color filter pattern layer CF1 are stacked right above the shielding pattern layer BM, and the color filter pattern layer CF4 and the color filter pattern layer CF2 are stacked right above the shielding pattern layer BM. Thereby, compared to the conventional OLED display panel, the display panel 10 may have a smaller cell gap (about 3 µm to about 15 µm), thereby allowing the display panel 10 to have a good viewing angle range and thus the color shift issue due to viewing angle change is improved. Owing to the arrangement of the stacked structure, the reflection amount of the ambient light by the display panel 10 is reduced, thereby omitting the use of any polarizer and avoiding discomfort to the users. As such, compared to the conventional OLED display panel, the display panel 10 has better display quality.

Besides, according to the embodiments shown in FIG. 1 and FIG. 2, the first openings of the pixel definition layer PDL are aligned with each other to form a matrix, the second openings of the shielding pattern layer BM are aligned with each other to form a matrix, and the third openings of the touch structure layer TP are aligned with each other to form a matrix; however, the invention is not limited thereto. Other ways to implement the invention are described below with reference to FIG. 3. Note that the reference numbers and some descriptions provided above are applicable in the following embodiments, where the same or similar reference numbers are used to represent the same or similar elements, and the descriptions of the same technical contents are omitted. Reference may be made to the foregoing embodiments for the omitted descriptions, and therefore no further explanation is provided in the following embodiments.

Figure 3:
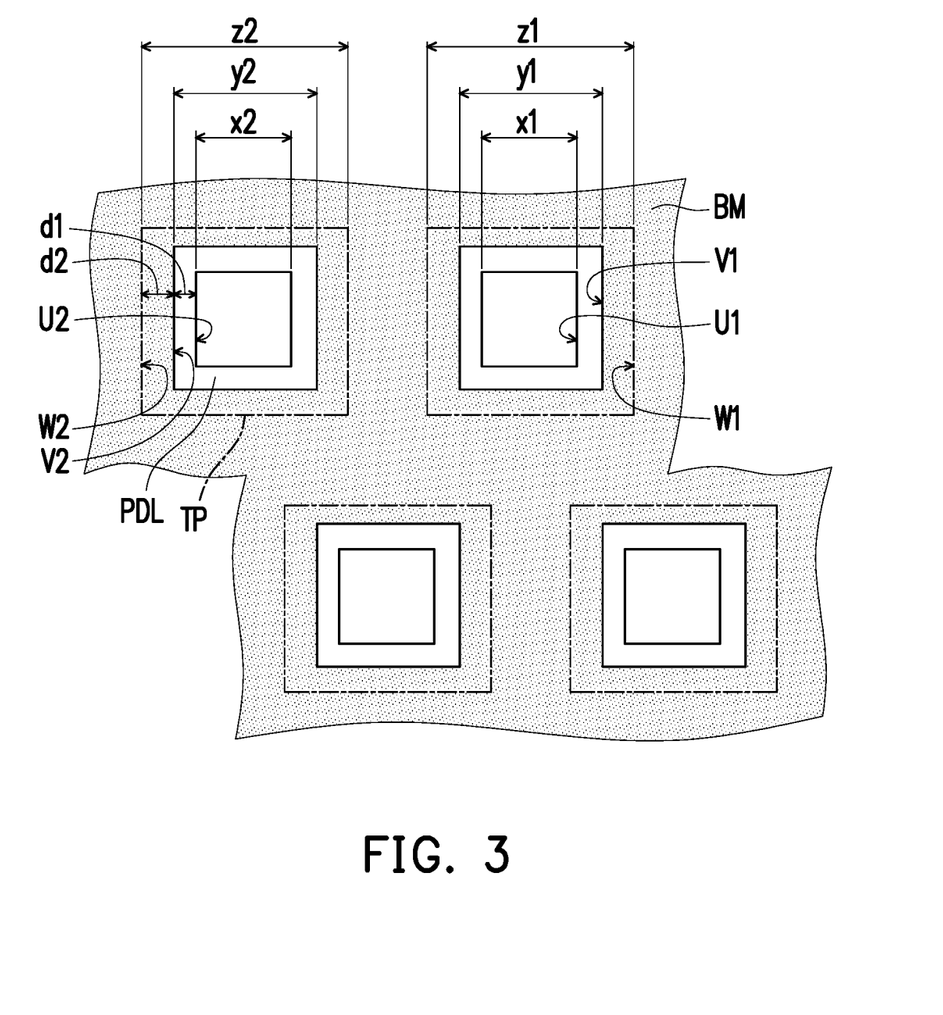
FIG. 3 is a schematic top view illustrating another arrangement of a pixel definition layer, a touch structure, and a shielding pattern layer.

FIG. 3 is a schematic top view illustrating an arrangement of a pixel definition layer, a touch structure, and a shielding pattern layer according to another embodiment. With reference to FIG. 3 and FIG. 2, the main differences between the embodiment shown in FIG. 3 and the embodiment shown in FIG. 2 lie in the way to arrange the first openings (including the first opening U1 and the first opening U2) of the pixel definition layer PDL, the way to arrange the second openings (including the second opening V1 and the second opening V2) of the shielding pattern layer BM, and the way to arrange the third openings (including the third opening W1 and the third opening W2) of the touch structure layer TP.

In the embodiment shown in FIG. 3, the first openings (including the first opening U1 and the first opening U2) of the pixel definition layer PDL are arranged in a staggered manner, the second openings (including the second opening V1 and the second opening V2) of the shielding pattern layer BM are arranged in a staggered manner, and the third openings (including the third opening W1 and the third opening W2) of the touch structure layer TP are arranged in a staggered manner.

To sum up, the display panel provided in one or more embodiments of the invention includes the active device located on the substrate, the first electrode electrically connected to the active device, the pixel definition layer having the first opening overlapped with the first electrode, the light emitting layer located within the first opening and on the first electrode, the second electrode disposed on the light emitting layer, the shielding pattern layer disposed on the second electrode and having a second opening overlapped with the first opening, one color filter pattern layer disposed on the second electrode and overlapped with the first opening and the second opening, and another color filter pattern layer stacked with said color filter pattern layer right above the shielding pattern layer. Hence, in comparison with the conventional OLED display panel, the display panel provided in one or more embodiments of the invention may have a smaller cell gap (about 3 µm to about 15 µm), thereby allowing the display panel to have a good viewing angle range and thus the color shift issue due to viewing angle change is improved. The reflection amount of the ambient light by the display panel provided in one or more embodiments of the invention is reduced in comparison with the conventional OLED display panel, thereby omitting the use of any polarizer and avoiding discomfort to the users. As such, compared to the conventional OLED display panel, the display panel provided in one or more embodiments of the invention has better display quality.

It will be apparent to those skilled in the art that various modifications and variations can be made to the structure described in the disclosure without departing from the scope or spirit of the disclosure. In view of the foregoing, it is intended that the disclosure cover modifications and variations provided they fall within the scope of the following claims and their equivalents.

What is claimed is:

1. A display panel, comprising:
   an active device, disposed on a substrate;
   a first electrode electrically connected to the active device;
   a pixel definition layer having a first opening overlapped with the first electrode;
   a light emitting layer, wherein at least a portion of the light emitting layer is disposed within the first opening and located on the first electrode;
   a second electrode disposed on the light emitting layer;
   a shielding pattern layer disposed on the second electrode, the shielding pattern layer having a second opening overlapped with the first opening;
   a first color filter pattern layer disposed on the second electrode and overlapped with the first opening and the second opening;
   a second color filter pattern layer disposed on the second electrode, wherein the first color filter pattern layer and the second color filter pattern layer are stacked with each other right above the shielding pattern layer; and
   a touch structure layer disposed between the second electrode and the shielding pattern layer, wherein the touch structure layer has a third opening overlapped with the first opening and the second opening, a width of the third opening is greater than a width of the second opening, and a stacked portion formed by the second color filter pattern layer and the first color filter pattern layer is not overlapped with the third opening.

2. The display panel as claimed in claim 1, wherein an edge of a vertical projection of the shielding pattern layer on the substrate protrudes by a distance to an edge of a vertical projection of the second color filter pattern layer on the substrate.

3. The display panel as claimed in claim 2, wherein the distance is from about 3 µm to about 10 µm.

4. The display panel as claimed in claim 1, wherein an edge of a vertical projection of the pixel definition layer on the substrate protrudes by a distance to an edge of a vertical projection of the shielding pattern layer on the substrate.

5. The display panel as claimed in claim 4, wherein the distance is from about 3 μm to about 10 μm.

6. The display panel as claimed in claim 1, wherein a light emitted via the light emitting layer and a light passing through the first color filter pattern layer have same color.

7. The display panel as claimed in claim 1, wherein a material of the pixel definition layer comprises a photosensitive polyimide material, a propylene-based material, a siloxane material, a phenolic resin material, oxides, nitrides, or oxynitrides.

8. The display panel as claimed in claim 1, further comprising:
a package structure layer disposed between the second electrode and the shielding pattern layer;
a cover plate disposed opposite to the substrate; and
a protection layer disposed between the second color filter pattern layer and the cover plate.

9. The display panel as claimed in claim 8, wherein the shielding pattern layer is in contact with the package structure layer.

10. The display panel as claimed in claim 1, wherein a minimum vertical distance from an upper surface of a portion of the second electrode overlapped with the light emitting layer to an upper surface of the shielding pattern layer is about 6 μm.

11. The display panel as claimed in claim 1, wherein the light emitting layer includes a white organic light emitting material.

12. A display panel, comprising:
a plurality of active devices disposed on a substrate;
a plurality of first electrodes electrically connected to the plurality of active devices, respectively;
a pixel definition layer having a plurality of first openings respectively overlapped with the first electrodes;
a plurality of light emitting layers respectively overlapped with the first openings and respectively located on the first electrodes;
at least one second electrode disposed on the light emitting layers;
a shielding pattern layer disposed on the at least one second electrode, the shielding pattern layer having a plurality of second openings overlapped with the first openings, respectively;
a first color filter pattern layer disposed on the at least one second electrode and overlapped with a corresponding one of the first openings and a corresponding one of the second openings;
a second color filter pattern layer disposed on the at least one second electrode, wherein a stacked portion formed by the second color filter pattern layer and the first color filter pattern layer is right above the shielding pattern layer and not overlapped with the second openings; and
a touch structure layer disposed between the at least one second electrode and the shielding pattern layer, wherein the touch structure layer has a plurality of third openings overlapped with the first openings and the second openings, a width of each of the third openings is greater than a width of each of the second openings, and a stacked portion formed by the second color filter pattern layer and the first color filter pattern layer is not overlapped with the third openings.

13. The display panel as claimed in claim 12, wherein the second openings are aligned to form a matrix.

14. The display panel as claimed in claim 12, wherein the second openings are arranged in a staggered manner.

* * * * *